(12) United States Patent
Hosonuma

(10) Patent No.: US 6,882,858 B1
(45) Date of Patent: Apr. 19, 2005

(54) FLEXIBLE BOARD AND METHOD OF FABRICATING THE SAME

(75) Inventor: Yoshimasa Hosonuma, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/444,166

(22) Filed: Nov. 22, 1999

(30) Foreign Application Priority Data

Nov. 24, 1998 (JP) ............................ 10-347972

(51) Int. Cl.$^7$ ............................................ H04M 1/00
(52) U.S. Cl. .................. 455/550.1; 333/247; 361/722; 455/333
(58) Field of Search ................. 455/550, 301, 455/300, 90, 317, 375, 327, 333, 78, 80, 81; 361/748, 744, 749, 753, 761, 764, 782, 794

(56) References Cited

U.S. PATENT DOCUMENTS

| | | | |
|---|---|---|---|
| 4,680,557 A | * 7/1987 | Compton | 333/1 |
| 4,707,671 A | * 11/1987 | Suzuki et al. | 333/1 |
| 5,057,798 A | * 10/1991 | Moye et al. | 333/33 |
| 5,241,454 A | * 8/1993 | Ameen et al. | 361/744 |
| 5,387,888 A | * 2/1995 | Eda et al. | 333/247 |
| 5,459,368 A | * 10/1995 | Onishi et al. | 310/313 R |
| 5,719,750 A | * 2/1998 | Iwane | 361/794 |
| 5,740,527 A | * 4/1998 | Mitama | 455/301 |
| 5,796,165 A | * 8/1998 | Yoshikawa et al. | 257/728 |
| 5,937,361 A | * 8/1999 | Smith | 455/575 |
| 6,101,372 A | * 8/2000 | Kubo | 455/90 |
| 6,133,805 A | * 10/2000 | Jain et al. | 333/1 |
| 6,139,364 A | * 10/2000 | Beutler et al. | 439/607 |
| 6,143,990 A | * 11/2000 | Kuramochi et al. | 174/260 |
| 6,178,311 B1 | * 1/2001 | Pance et al. | 455/78 |
| 6,252,778 B1 | * 6/2001 | Tonegawa et al. | 361/761 |

FOREIGN PATENT DOCUMENTS

| | | |
|---|---|---|
| JP | 4313300 A * | 11/1992 |
| JP | 5-3395 | 1/1993 |
| JP | 7-111371 | 4/1995 |
| JP | 7-170089 | 7/1995 |
| JP | 8-122806 | 5/1996 |
| JP | 9-138388 | 5/1997 |
| JP | 9-197425 | 7/1997 |
| JP | 10-74550 | 3/1998 |
| JP | 10-133218 | 5/1998 |

OTHER PUBLICATIONS

Abstract of JP 7 122 882 A dated May 12, 1995.
Abstract of JP 4 313 300 A dated Nov. 5, 1992.

* cited by examiner

Primary Examiner—Charles Appiah
Assistant Examiner—Joy Contee
(74) Attorney, Agent, or Firm—Scully, Scott, Murphy & Presser

(57) ABSTRACT

There is provided a flexible board including (a) an internal layer, (b) a line formed in a first area of the internal layer, the line radiating unnecessary radiation, (c) a first ground layer formed on an upper surface of the internal layer, the first ground layer disallowing radiation to pass therethrough, and (d) a second ground layer formed a lower surface of the internal layer, the second ground layer disallowing radiation to pass therethrough. The flexible board prevents unnecessary radiation from outwardly radiating without an increase in a size thereof.

15 Claims, 4 Drawing Sheets

FLEXIBLE BOARD AND METHOD OF FABRICATING THE SAME

BACKGROUND OF THE INVENTION

1. Field of the Invention

The invention relates to a flexible board capable of preventing generation of unnecessary radiation therefrom, a method of fabricating such a flexible board, and a cellular phone including such a flexible board.

2. Description of the Related Art

A cellular phone has been required to be light in weight, small in size, and thin in thickness. In order to meet such requirement, various parts to be incorporated into a body of a cellular phone are also required to be light, small and thin. In addition, since unnecessary radiation might exert harmful influence on sensitivity of a cellular phone on receiving radio signals, a cellular phone is required not to be influenced by unnecessary radiation.

The above-mentioned unnecessary radiation is radiated a lot from a bus line and a clock line among memories and controllers, for instance. If what unnecessary radiation radiates such as the above-mentioned bus line and clock line is formed on a flexible board, it would be quite difficult to prevent unnecessary radiation from radiating from what unnecessary radiation radiates. Hence, only limited kinds of lines are allowed to be formed on a flexible board.

In order to avoid this problem, a flexible board has been conventionally designed to have a multi-layered printed structure, and what unnecessary radiation radiates a lot such as a bus line and a clock line has been formed on an internal layer in the multi-layered printed structure to thereby minimize generation of unnecessary radiation therefrom. A line which is likely to be influenced by unnecessary radiation has been conventionally formed also on an internal layer in the multi-layered printed structure.

However, if a bus line and a clock line are to be arranged on an internal layer in the multi-layered printed structure, it would be unavoidable for the multi-layered printed structure to become large in order to ensure a space for arranging those lines. If the multi-layered printed structure is large in size, it would be impossible to incorporate the flexible board into a cellular phone required to be as small as possible.

Japanese Unexamined Patent Publication No. 5-3395 has suggested a flexible printed board including a circuit sandwiched between flexible insulating layers. A shield layer composed of metal and having a thickness equal to or smaller than 5 μm is formed on a surface of one of the flexible insulating layers. A second insulating layer for fixing the shield layer onto the flexible insulating layers is adhered onto both the shield layer and the flexible insulating layers through adhesive layers.

Japanese Unexamined Patent Publication No. 7-111371 has suggested a flexible printed board including a first insulating layer formed at a predetermined location with a first contact hole, a wiring layer, a second insulating layer formed at a predetermined location with a second contact hole, a first electromagnetic shield layer comprised of a third insulating layer and a first electrically conductive layer such that the first electrically conductive layer makes contact with the first insulating layer, the first electromagnetic shield layer being formed with a first through-hole above the first contact hole, the wiring layer and the first electromagnetic shield layer being electrically connected to each other through electrical conductor filled in the first contact hole and the first through hole, an adhesive layer formed around the electrical conductor between the first insulating layer and the first electrically conductive layer, a second electromagnetic shield layer comprised of a fourth insulating layer and a second electrically conductive layer such that the second electrically conductive layer makes contact with the second insulating layer, the second electromagnetic shield layer being formed with a second through-hole above the second contact hole, the wiring layer and the second electromagnetic shield layer being electrically connected to each other through electrical conductor filled in the second contact hole and the second through hole, and an adhesive layer formed around the electrical conductor between the second insulating layer and the second electrically conductive layer.

Japanese Unexamined Patent Publication No. 8-122806 has suggested a liquid crystal display device having a multi-layered flexible substrate. The suggested liquid crystal display device is comprised of a chip-on-glass type liquid crystal display unit including two transparent insulating substrates overlapping each other, a drive integrated circuit being mounted on one of the transparent insulating substrates, and a multi-layered flexible substrate having three or more electrically conductive layers, electrically connected to an input terminal pattern of the drive integrated circuit, and arranged outside at least on side of the liquid crystal display unit.

Japanese Unexamined Patent Publication No. 9-138388 has suggested a liquid crystal display device including a liquid crystal display unit and a first circuit substrate electrically connected to the liquid crystal display unit. The first circuit substrate partially overlaps the liquid crystal display unit as viewed perpendicularly to the first circuit substrate.

Japanese Unexamined Patent Publication No. 9-197425 has suggested a liquid crystal display device including a liquid crystal display panel, a circuit board for driving liquid crystal, divided into at least two pieces, an electrically conductive layer supported by a substrate layer, and a joiner for electrically connecting the divided circuit boards to each other. The joiner is comprised of a signal layer contributing to electrical connection of the divided circuit boards, and a ground layer.

Japanese Unexamined Patent Publication No. 10-74550 has suggested a liquid crystal display device comprised of a first circuit board, a second circuit board, and a connector for electrically connecting the first and second circuit boards to each other, an electrical conductor covering an outer surface of the connector. At least one of ground lines or a power supply line of the first and second circuit boards is electrically connected to the electrical conductor.

Japanese Unexamined Patent Publication No. 10-133218 has suggested a tape carrier package on which IC chip is mounted. The tape carrier package has a base film at a terminal thereof for preventing scattering, and a wiring is formed on the base film.

Japanese Unexamined Patent Publication No. 7-170089 has suggested a flexible printed wiring board comprising a substrate composed of an electrically insulating film and formed at a surface thereof with an electrically conductive path, an electrically insulating layer covering the electrically conductive path therewith, an external layer composed of an electrical conductor having a greater size than that of said electrically conductive path and formed on the electrically insulating layer and the substrate, and couplers extending throughout the substrate to thereby electrically couple the external layers to each other at a location out of the electrically conductive path, the couplers being arranged at a pitch smaller than a predetermined pitch in a direction in which a signal is transmitted.

SUMMARY OF THE INVENTION

In view of the above-mentioned problems, it is an object of the present invention to provide a flexible board which is capable of preventing generation of unnecessary radiation therefrom without an increase in size and thickness.

It is also an object of the present invention to provide a method of fabricating such a flexible board.

In one aspect of the present invention, there is provided a flexible board including (a) an internal layer, (b) a line formed in a first area of the internal layer, the line radiating unnecessary radiation, (c) a first ground layer formed on an upper surface of the internal layer, the first ground layer disallowing radiation to pass therethrough, and (d) a second ground layer formed a lower surface of the internal layer, the second ground layer disallowing radiation to pass therethrough.

It is preferable that the flexible board further includes (e) a first cover layer formed over a surface of the first ground layer, and (f) a second cover layer formed over a surface of the second ground layer.

It is preferable that the flexible board further includes electrically insulating adhesive layers sandwiched among the internal layer, the first and second ground layers, and the first and second cover layers.

It is preferable that the flexible board further includes a ground line formed in a second area except the first area in the internal layer.

It is preferable that a plurality of through-holes may be formed throughout the first ground layer, the internal layer, and the second ground layer.

It is preferable that a plurality of through-holes is formed throughout the first ground layer, the ground line, and the second ground layer, and that the through-holes electrically connects the first ground layer, the ground line, and the second ground layer to one another.

In another aspect of the present invention, there is provided a method of fabricating a flexible board, including the steps of (a) forming a line in a first area of an internal layer, the line radiating unnecessary radiation, (b) covering an upper surface of the internal layer with a first ground layer which disallows radiation to pass therethrough, and (c) covering a lower surface of the internal layer with a second ground layer which disallows radiation to pass therethrough.

It is preferable that the method further includes the steps of (d) covering a surface of the first ground layer with a first cover layer, and (e) covering a surface of the second ground layer with a second cover layer.

It is preferable that the method further includes the step of forming electrically insulating adhesive layers among the internal layer, the first and second ground layers, and the first and second cover layers.

It is preferable that the method further includes the step of forming a ground line in a second area except the first area in the internal layer.

It is preferable that the method further includes the step of forming a plurality of through-holes throughout the first ground layer, the internal layer, and the second ground layer.

It is preferable that the method further includes the step of forming a plurality of through-holes throughout the first ground layer, the ground line, and the second ground layer so that the through-holes electrically connect the first ground layer, the ground line, and the second ground layer to one another.

In still another aspect of the present invention, there is provided a cellular phone including such a flexible board as mentioned above.

The advantages obtained by the aforementioned present invention will be described hereinbelow.

In accordance with the present invention, the first and second ground layers and the ground lines prevent radiation of unnecessary radiation from the flexible board and entrance of unnecessary radiation into the flexible board. Hence, it is possible for the flexible board to be harmfully influenced by unnecessary radiation. In addition, since the first and second ground layers and the ground lines are formed planar in the internal layer, the flexible board can have the above-mentioned advantages without an increase in size and thickness.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 1:
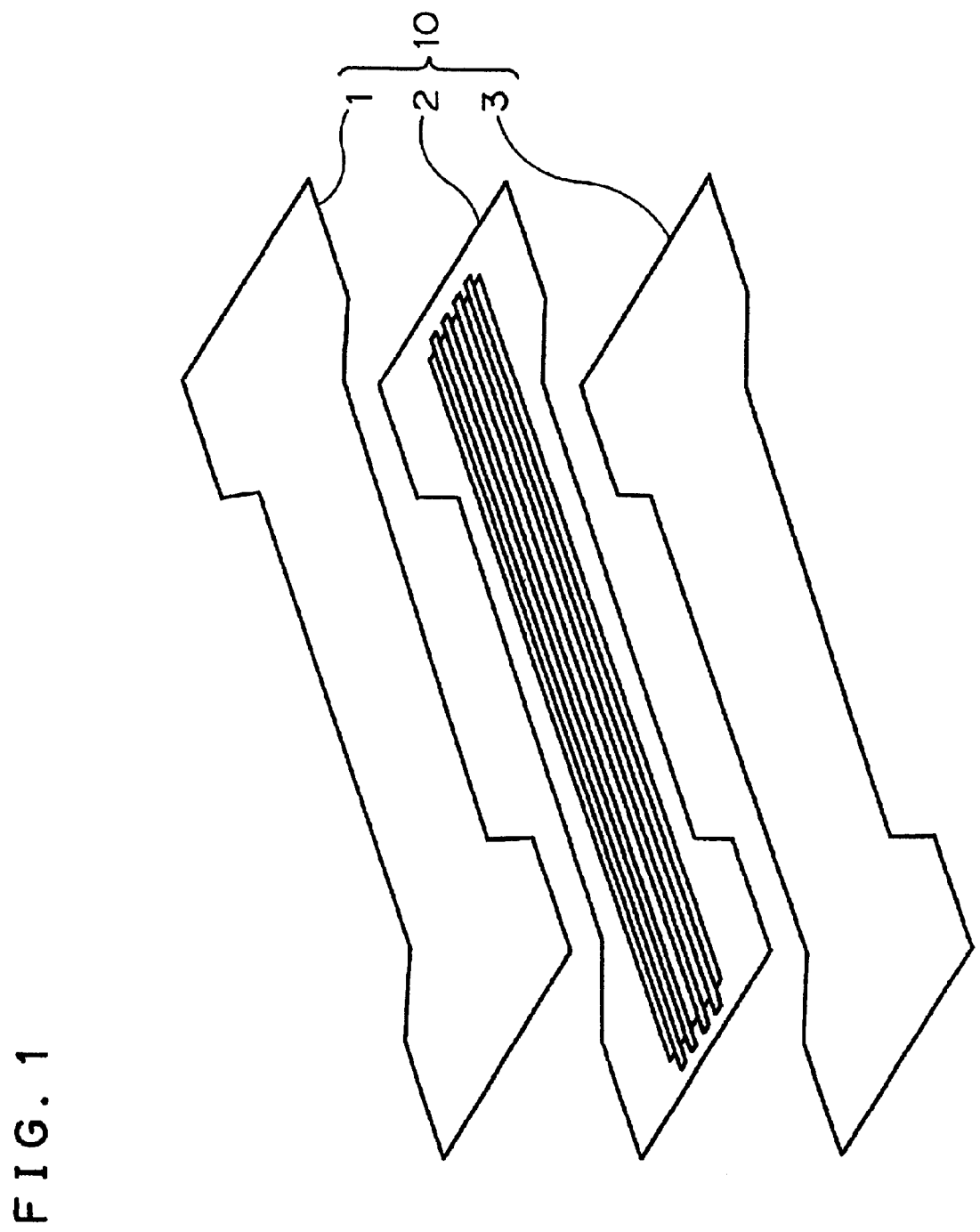
FIG. 1 is an exploded perspective view of a flexible board in accordance with the embodiment of the present invention.

With reference to FIG. 1, a flexible board in accordance with a preferred embodiment is designed to have a three-layered structure including an internal layer 2, a first ground layer 1 covering an upper surface of the internal layer 2 therewith, and a second ground layer 3 covering a lower surface of the internal layer 2 therewith. A bus line and a clock line are arranged in the internal layer 2. These bus line and clock line radiates unnecessary radiation a lot.

Figure 2:
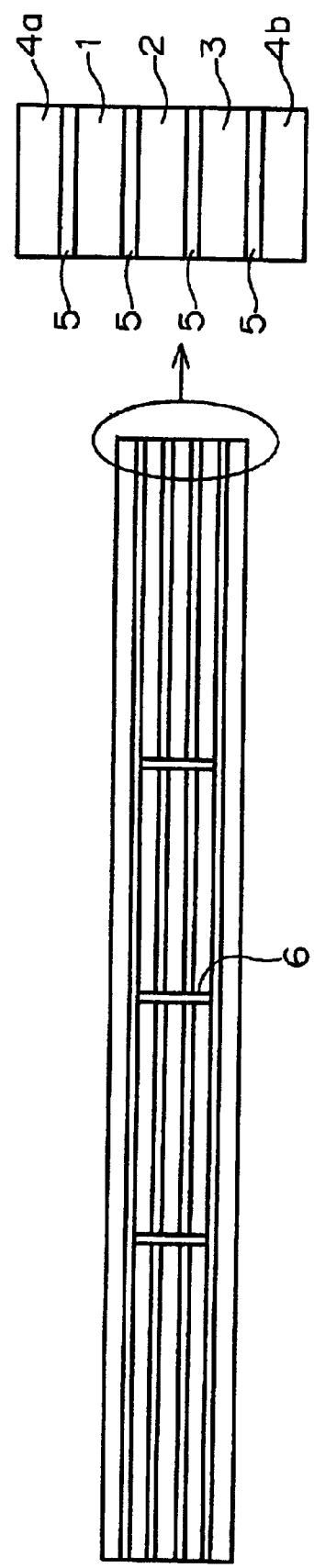
FIG. 2 is a cross-sectional view of the flexible board illustrated in FIG. 1.

The three-layered flexible board illustrated in FIG. 1 is sandwiched with electrically insulating first and second cover layers 4a and 4b, as illustrated in FIG. 2. Specifically, the first cover layer 4a covers a surface of the first ground layer 1 therewith, and the second cover layer 4b covers a surface of the second ground layer 4b therewith.

The internal layer 2, the first and second ground layers 1 and 3, and the first and second cover layers 4a and 4b are adhered to one another through electrically insulating adhesive layers 5 sandwiched between the adjacent layers.

A plurality of through-holes 6 is formed throughout the first ground layer 1, the internal layer 2, the said second ground layer 3.

Hereinbelow is explained an operation of the flexible board in accordance with the embodiment. That is, the flexible board in accordance with the embodiment prevents radiation of unnecessary radiation therefrom and entrance of unnecessary radiation thereinto.

Figure 3:
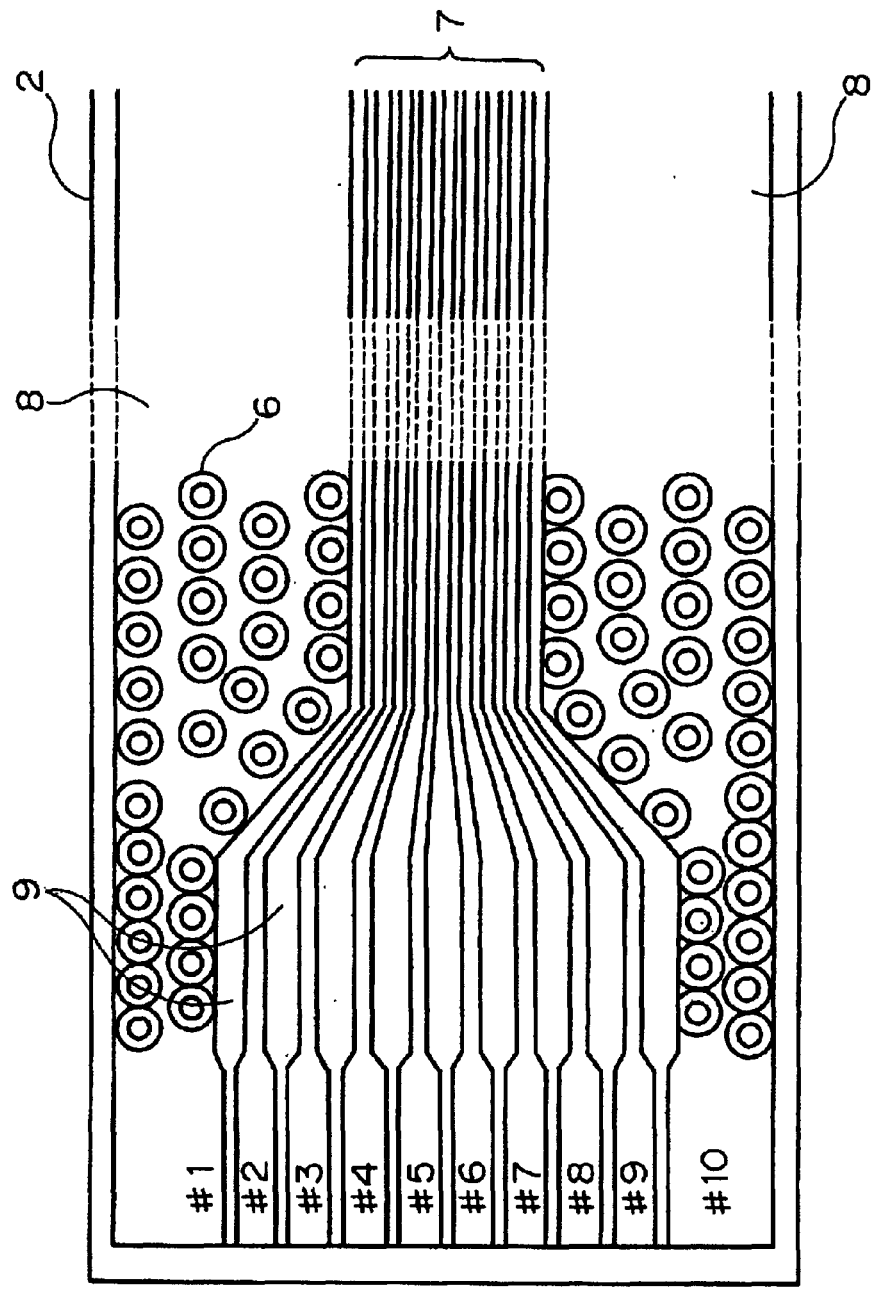
FIG. 3 is a plan view of the internal layer constituting the flexible board illustrated in FIG. 1.

FIG. 3 is a plan view of the internal layer 2 on which a plurality of bus lines 7 is arranged. In FIG. 3, the bus lines 7 are indicated as #2 to #9. Ground lines 8 are arranged at opposite sides of the bus lines 7. In FIG. 3, the ground lines are indicated as #1 and #10. The ground lines 8 are formed with a plurality of through-holes 6.

Insulating layers 9 are formed between the ground lines 8 and the bus lines 7, and further between the adjacent bus lines 7 in order to electrically insulate them from one another.

Figure 4:
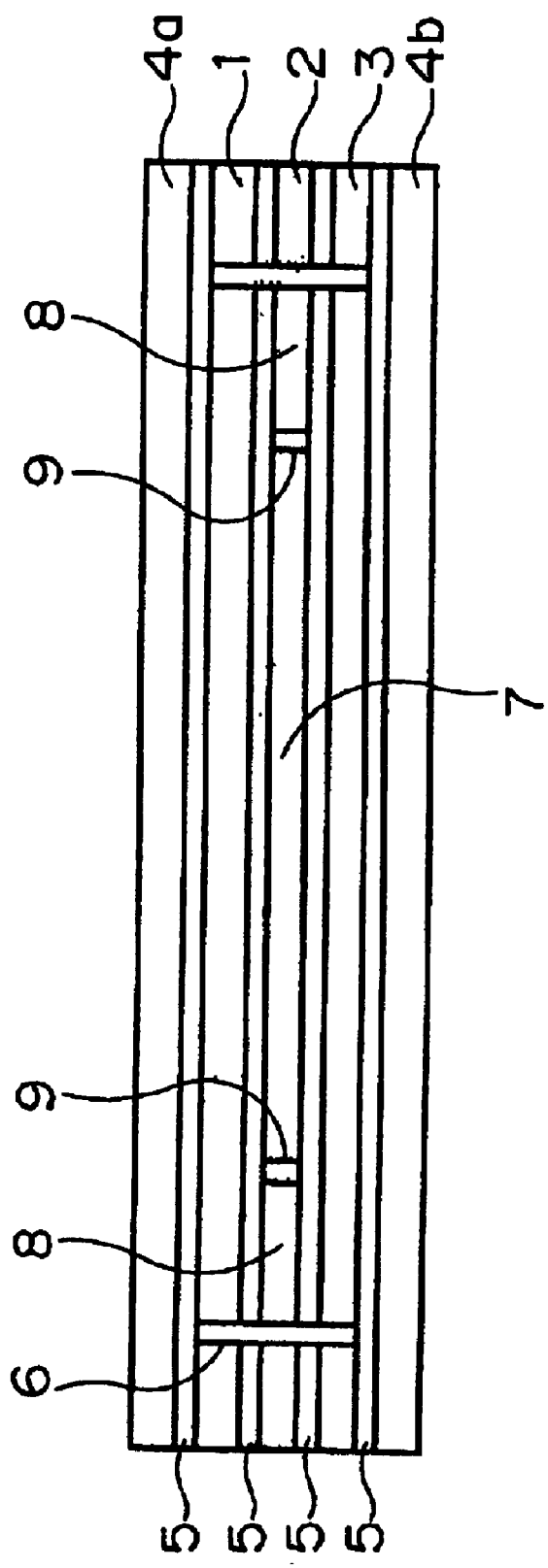
FIG. 4 is a cross-sectional view of a flexible board including the internal layer illustrated in FIG. 3.

As illustrated in FIG. 4, the internal layer 2 is sandwiched between the first and second ground layers 1 and 3. Thus, the bus lines 7 are surrounded by the first ground layer 1, the second ground layer 3, and the ground lines 8. The first ground layer 1, the second ground layer 3, and the ground lines 8 cooperate with each other to thereby establish a shield by which unnecessary radiation is prevented from being radiated outside of the bus lines 7.

The first ground layer 1, the second ground layer 3, and the ground lines 8 are electrically connected to one another through a plurality of the through-holes 6. The through-holes 6 make the first ground layer 1, the second ground layer 3, and the ground lines 8 act as common ground.

The shield established by the first ground layer 1, the second ground layer 3, and the ground lines 8 can be strengthened by much more stabilizing the first ground layer 1, the second ground layer 3, and the ground lines 8. For instance, the ground lines 8 may be formed in a larger area in order to enhance stability of the first ground layer 1, the second ground layer 3, and the ground lines 8. In such a case, it is preferable to increase the number of the throughholes 6 to thereby increase the common ground defined by the first ground layer 1, the second ground layer 3, and the ground lines 8.

By enhancing stability of the first and second ground layers 1 and 3 and the ground lines 8, they are protected from being influenced by the bus lines 7. As a result, unnecessary radiation is radiated out of the first and second ground layers 1 and 3 and the ground lines 8 to a less degree.

As mentioned so far, in accordance with the embodiment, the bus lines 7 formed on the internal layer 2 are surrounded by the ground lines 8 and the first and second ground layers 1 and 3. Hence, unnecessary radiation is prevented from being radiated out of the bus lines 7 by shield effect provided by the ground lines 8 and the first and second ground layers 1 and 3.

The three-layered flexible board 10 including the internal layer 2 and the first and second ground layers 1 and 3 has flexibility, and allows to form a three-dimensional wiring. Hence, it is possible to incorporate the flexible board 10 into a body of a cellular phone having a lot of limitations with respect to a space, ensuring a smaller and thinner cellular phone.

Though the bus lines 7 are formed on the internal layer 2 in the above-mentioned embodiment, the above-mentioned shield effect provided by the ground lines 8 and the first and second ground layers 1 and 3 can be obtained when clock lines are formed on the internal layer 2.

In addition, the shield effect prevents unnecessary radiation from entering the flexible board 10, it is also possible to form a line on the internal layer 2 which line is likely to be harmfully influenced by unnecessary radiation.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 10-347972 filed on Nov. 24, 1998 including specification, claims, drawings and summary is incorporated herein by reference in its entirety.

What is claimed is:

1. A flexible board comprising:
    (a) an internal layer;
    (b) a plurality of bus lines arranged on said internal layer, said plurality of bus lines radiating unnecessary radiation;
    (c) a first ground layer formed on an upper surface of said internal layer, said first ground layer disallowing radiation to pass therethrough;
    (d) a second ground layer formed on a lower surface of said internal layer, said second ground layer disallowing radiation to pass therethrough; and
    (e) ground lines arranged at opposite sides of said plurality of bus lines, such that said first ground layer, said second ground layer and said ground lines surround said plurality of bus lines and establish a shield by which unnecessary radiation is prevented from being radiated outside of said plurality of bus lines.

2. The flexible board as set forth in claim 1, further comprising:
    (f) a first cover layer formed over a surface of said first ground layer; and
    (g) a second cover layer formed over a surface of said second ground layer.

3. The flexible board as set forth in claim 2, further comprising electrically insulating adhesive layers sandwiched among said internal layer, said first and second ground layers, and said first and second cover layers.

4. The flexible board as set forth in claim 1, wherein a plurality of throughholes is formed throughout said first ground layer, said internal layer, and said second ground layer.

5. The flexible board as set forth in claim 1, wherein a plurality of throughholes is formed throughout said first ground layer, said ground lines, and said second ground layer, said through-holes electrically connecting said first ground layer, said ground lines, and said second ground layer to one another.

6. A method of fabricating a flexible board, comprising the steps of:
    (a) forming a plurality of bus lines on said internal layer, said plurality of bus lines radiating unnecessary radiation;
    (b) covering an upper surface of said internal layer with a first ground layer which disallows radiation to pass therethrough;
    (c) covering a lower surface of said internal layer with a second ground layer which disallows radiation to pass therethrough; and
    (d) forming ground lines arranged at opposite sides of said plurality of bus lines, such that said first ground layer, said second ground layer and said ground lines surround said plurality of bus lines and establish a shield by which unnecessary radiation is prevented from being radiated outside of said plurality of bus lines.

7. The method as set forth in claim 6, further comprising the steps of:
    (e) covering a surface of said first ground layer with a first cover layer; and
    (f) covering a surface of said second ground layer with a second cover layer.

8. The method as set forth in claim 7, further comprising the step of forming electrically insulating adhesive layers among said internal layer, said first and second ground layers, and said first and second cover layers.

9. The method as set forth in claim 6, further comprising the step of forming a plurality of through-holes throughout said first ground layer, said internal layer, and said second ground layer.

10. The method as set forth in claim 6, further comprising the step of forming a plurality of through-holes throughout said first ground layer, said ground lines, and said second ground layer so that said through-holes electrically connect said first ground layer, said ground lines, and said second ground layer to one another.

11. A cellular phone including a flexible board, said flexible board comprising:

(a) an internal layer;

(b) a plurality of bus lines arranged on said internal layer, said plurality of bus lines radiating unnecessary radiation;

(c) a first ground layer formed on an upper surface of said internal layer, said first ground layer disallowing radiation to pass therethrough; and (d) a second ground layer formed on a lower surface of said internal layer, said second ground layer disallowing radiation to pass therethrough; and (e) ground lines arranged at opposite sides of said plurality of bus lines, such that said first ground layer, said second ground layer and said ground lines surround said plurality of bus lines and establish a shield by which unnecessary radiation is prevented from being radiated outside of said plurality of bus lines.

12. The cellular phone as set forth in claim 11, further comprising:

(f) a first cover layer formed over a surface of said first ground layer; and (g) a second cover layer formed over a surface of said second ground layer.

13. The cellular phone as set forth in claim 12, further comprising electrically insulating adhesive layers sandwiched among said internal layer, said first and second ground layers, and said first and second cover layers.

14. The cellular phone as set forth in claim 11, wherein a plurality of through-holes is formed throughout said first ground layer, said internal layer, and said second ground layer.

15. The cellular phone as set forth in claim 11, wherein a plurality of through-holes is formed throughout said first ground layer, said ground lines, and said second ground layer, said through-holes electrically connecting said first ground layer, said ground lines, and said second ground layer to one another.

* * * * *